(12) United States Patent
Yuan et al.

(10) Patent No.: US 7,087,497 B2
(45) Date of Patent: Aug. 8, 2006

(54) LOW-THERMAL-BUDGET GAPFILL PROCESS

(75) Inventors: Zheng Yuan, Fremont, CA (US); Reza Arghavani, Scotts Valley, CA (US); Ellie Y Yieh, San Jose, CA (US); Shankar Venkataraman, Santa Clara, CA (US)

(73) Assignee: Applied Materials, Santa Clara, CA (US)

( * ) Notice: Subject to any disclaimer, the term of this patent is extended or adjusted under 35 U.S.C. 154(b) by 63 days.

(21) Appl. No.: 10/793,559

(22) Filed: Mar. 4, 2004

(65) Prior Publication Data

US 2005/0196929 A1    Sep. 8, 2005

(51) Int. Cl.
*H01L 21/336* (2006.01)

(52) U.S. Cl. .................. 438/295; 438/296; 438/294

(58) Field of Classification Search .............. 438/295
See application file for complete search history.

(56) References Cited

U.S. PATENT DOCUMENTS

| | | | |
|---|---|---|---|
| 4,690,746 A | 9/1987 | McInerney et al. | |
| 4,737,379 A | 4/1988 | Hudgens et al. | |
| 4,835,005 A | 5/1989 | Hirooka et al. | |
| 4,890,575 A | 1/1990 | Ito et al. | |
| 5,000,113 A | 3/1991 | Wang et al. | |
| 5,521,126 A | 5/1996 | Okamura et al. | |
| 5,645,645 A | 7/1997 | Zhang et al. | |
| 5,712,185 A * | 1/1998 | Tsai et al. ............ | 438/424 |
| 5,719,085 A | 2/1998 | Moon et al. | |
| 5,804,259 A | 9/1998 | Robles | |
| 5,872,058 A | 2/1999 | Van Cleemput et al. | |
| 5,910,342 A | 6/1999 | Hirooka et al. | |
| 5,916,365 A | 6/1999 | Sherman | |
| 5,923,056 A | 7/1999 | Lee et al. | |
| 5,976,327 A | 11/1999 | Tanaka | |
| 5,990,013 A | 11/1999 | Berenguer et al. | |
| 6,013,191 A | 1/2000 | Nasser-Faili et al. | |
| 6,013,584 A | 1/2000 | M'Saad | |
| 6,025,627 A | 2/2000 | Forbes et al. | |
| 6,030,881 A | 2/2000 | Papasouliotis et al. | |
| 6,039,851 A | 3/2000 | Iyer | |
| 6,087,249 A * | 7/2000 | Gardner et al. ........... | 438/585 |
| 6,194,038 B1 | 2/2001 | Rossum | |
| 6,200,893 B1 | 3/2001 | Sneh | |
| 6,217,658 B1 | 4/2001 | Orczyk et al. | |
| 6,228,751 B1 | 5/2001 | Yamazaki et al. | |

(Continued)

FOREIGN PATENT DOCUMENTS

EP    442 490 A1    8/1991

(Continued)

OTHER PUBLICATIONS

"Atomic Layer Deposition" by Physical Inorganic Chemistry, Institute of Applied Synthetic Chemistry, downloaded from website http://www.ias.tuwien.ac.at/research/fghh/research/pic_research_ald.html on Jul. 23, 2002.

(Continued)

*Primary Examiner*—Thao P. Le
(74) *Attorney, Agent, or Firm*—Townsend Townsend Crew, LLP

(57) ABSTRACT

A low-thermal-budget gapfill process is provided for filling a gap formed between two adjacent raised features on a strained-silicon substrate as part of a shallow-trench-isolation process. An electrically insulating liner is deposited using atomic-layer deposition and polysilicon is deposited over the electrically insulating liner, with both stages being conducted at temperatures below 700° C.

16 Claims, 8 Drawing Sheets

U.S. PATENT DOCUMENTS

| | | |
|---|---|---|
| 6,270,572 B1 | 8/2001 | Kim et al. |
| 6,305,314 B1 | 10/2001 | Sneh et al. |
| 6,313,010 B1 | 11/2001 | Nag et al. |
| 6,342,277 B1 | 1/2002 | Sherman |
| 6,355,561 B1 | 3/2002 | Sandhu et al. |
| 6,395,150 B1 | 5/2002 | Van Cleemput et al. |
| 6,416,822 B1 | 7/2002 | Chiang et al. |
| 6,428,859 B1 | 8/2002 | Chiang et al. |
| 6,596,654 B1 | 7/2003 | Bayman et al. |
| 6,897,508 B1* | 5/2005 | Sneh .................... 257/301 |
| 2001/0002280 A1 | 5/2001 | Sneh |
| 2001/0028924 A1 | 10/2001 | Sherman |
| 2001/0031562 A1 | 10/2001 | Raaijmakers et al. |
| 2001/0041250 A1* | 11/2001 | Werkhoven et al. ........ 428/212 |
| 2002/0031618 A1 | 3/2002 | Sherman |
| 2002/0052128 A1 | 5/2002 | Yu et al. |
| 2002/0068466 A1 | 6/2002 | Lee et al. |
| 2003/0124818 A1* | 7/2003 | Luo et al. ................ 438/482 |
| 2005/0045092 A1* | 3/2005 | Wu et al. ................ 117/92 |

FOREIGN PATENT DOCUMENTS

| | | |
|---|---|---|
| EP | 526 779 B1 | 2/1993 |
| GB | 2 267 291 A | 12/1993 |
| GB | 2 355 727 A | 5/2001 |
| JP | 02-058836 A | 2/1990 |
| JP | 07-161703 A | 6/1995 |
| WO | WO 00/15865 A1 | 3/2000 |
| WO | WO 00/54320 A1 | 9/2000 |
| WO | WO 00/61833 A1 | 10/2000 |
| WO | WO 01/40541 A1 | 6/2001 |
| WO | WO 01/66832 A2 | 9/2001 |

OTHER PUBLICATIONS

George et al., "Atomic layer controlled deposition of $SiO_2$ and $Al_2O_3$ using ABAB . . . binary reaction sequence chemistry," *Applied Surface Science*, 82/83:460-467 (1994).

George et al., "Surface Chemistry for Atomic Layer Growth," *J. Phys. Chem.*, 100(31):13121-13131 (1996).

Klaus et al., "Atomic layer controlled growth of $SiO_2$ films using binary reaction sequence chemistry," *Appl. Phys. Lett.*, 70(9): 1092-1094 (1997).

Klaus et al., "Atomic Layer Deposition of $SiO_2$ Using Catalyzed and Uncatalyzed Self-Limiting Surface Reactions," *Surface Review and Letters*, 6(3/4):435-448 (1999).

Morishita et al., "New substances for atomic-layer deposition of silicon dioxide," *J. Non-Crystalline Solids*, 187:66-69 (1995).

Nalwa, H.S., *Handbook of Low and High Dielectric Constant Materials and Their Applications*, vol. 1, p. 66 (1999).

Nguyen, S.V., "High-Density Plasma Chemical Vapor Deposition of Silicon-Based Dielectric Films for Integrated Circuits," *Journal of Research and Development*, 43(1/2) (1999).

Park, Yongjik & Kim, Kinam "COB Stack DRAM Cell Technology beyond 100 nm Technology Node (invited paper)" 2001 IEEE, 4 pages.

Singer, Peter "Strained Silicon Ready for Prime Time" Semiconductor International, Nov. 1, 2002, 3 pages.

Vassiliev et al., "Trends in Void-Free Pre-Metal CVD Dielectrics," *Solid State Technology*, pp. 129-136 (2001).

Wise et al., "Diethyldiethoxysilane as a New Precursor for $SiO_2$ Growth on Silicon," from *Gas-Phase and SurfaceChemistry in electronic Materials Processing*, Mountziaris et al., eds., from Symposium held Nov. 29, 1993 thru Dec. 2, 1993 in Boston Massachusetts, pp. 37-43.

Yamaguchi et al., "Atomic-layer chemical-vapor-deposition of silicon dioxide films with an extremely low hydrogen content," *Applied Surface Science*, 130-132:202-207 (1998).

* cited by examiner

LOW-THERMAL-BUDGET GAPFILL PROCESS

BACKGROUND OF THE INVENTION

One of the primary steps in the fabrication of modern semiconductor devices is the formation of an electrically insulating film on a semiconductor substrate. Such insulating films are used for a variety of purposes. For example, in some instances adjacent conductive layers may be separated, such as where an intermetal dielectric ("IMD") layer is used to separate adjacent metal lines or where a premetal dielectric ("PMD") layer is used to separate a metal layer from the conductive substrate. In other instances, adjacent active regions of the substrate may be separate, such as in shallow-trench-isolation ("STI") structures.

For processes in which IMD or PMD layers are formed in an integrated circuit, or for processes used in the formation of STI structures, it is typically necessary to fill gaps defined between adjacent structures. For example, FIG. 1 provides a simplified cross-sectional view of a partially completed integrated circuit 100. This integrated circuit is formed over a substrate 104 that includes a plurality of STI structures, each of which is typically created by forming a thin pad oxide layer 120 over the surface of the substrate 104 and then forming a silicon nitride layer 116 over the pad oxide layer 120. The nitride and oxide layers are then patterned using standard photolithography techniques and trenches 124 are etched through the nitride/oxide stack into the substrate 104. FIG. 1 shows that the integrated circuit may comprise areas 108 that are relatively densely packed with transistors or other active devices, and may comprise open areas 112 that are relatively isolated. Active devices in the open areas 112 may be separated from each other by more than an order of magnitude than separations in the densely packed areas 108.

Subsequently, the trenches 124 are filled with an electrically insulating material such as silicon dioxide using a deposition process that has good gapfill properties. Examples of such techniques include plasma deposition processes, such as plasma-enhanced chemical-vapor deposition ("PECVD") and high-density-plasma chemical-vapor deposition ("HDP-CVD"), as well as thermal chemical-vapor deposition ("CVD") processes. In some instances, prior to the gapfill process, an initial lining layer is deposited over the substrate as an in situ steam generation ("ISSG") or other thermal oxide layer, or perhaps a silicon nitride layer. One benefit to depositing such a liner prior to filling the trenches 124 is to provide appropriate corner rounding, which may aid in avoiding such effects as early gate breakdown in transistors that are formed. In addition, such a liner may aid in relieving stress after the CVD deposition.

While this technique has had good success in applications having relatively high thermal budgets, it is not compatible with applications in which thermal budgets are more restrictive. For instance, a recent trend towards the use of materials that impose more restrictive thermal budgets is exemplified by the use of strained silicon components instead of more conventional unstrained materials. Strained silicon is increasingly advocated for use in device channels as a mechanism for enhancing channel mobility, and is expected to dominate high-performance devices having feature sizes of 65 nm or less. The biaxial tensile stress that provides strained silicon with its desirable properties is, however, destroyed when the material is subjected to the high temperatures used in the process described above.

There is, accordingly, a general need in the art for approaches to filling gaps that meet lower thermal budgets.

BRIEF SUMMARY OF THE INVENTION

Embodiments of the invention thus provide a gapfill process that may be conducted at temperatures less than 700° C. The gap is formed between two adjacent raised features on a strained-silicon substrate as part of a shallow-trench-isolation process, and the gapfill process includes two stages. In the first stage, an electrically insulating line is deposited atomic-layer deposition and, in the second stage, polysilicon is deposited over the electrically insulating liner, with both stages being conducted at temperatures below 700° C.

In some instances, the substrate may be exposed to a metal precursor reactant introduced into a chamber in which the substrate is disposed such that one or more layers of the metal precursor reactant are adsorbed onto the substrate. The chamber may then be purged of the metal precursor reactant, and the adsorbed metal precursor reactant exposed to radicals formed from a second reactant to produce the electrically insulating liner. The radicals may comprise oxygen radicals to produce a liner that comprises a metal oxide layer, or may comprise nitrogen radicals to produce a liner that comprises a metal nitride layer. Examples of metals that may be comprised by the metal precursor reactant include Ti, Ga, Zr, Sn, Co, V, Pt, Pd, Fe, Ni, Mo, W, Ag, Au, Hf, Cr, Cu, Mn, La, Y, Al, Gd, Nd, Sm, Si, Nb, Ta, and In.

In some cases, deposition of the polysilicon may comprise a chemical-vapor-deposition process. A flow of a silicon-containing gas is provided to a chamber and heated to a temperature less than 700° C. to deposit the polysilicon from the flow. A flow of a dopant precursor gas may additionally be flowed to dope the polysilicon.

In some embodiments, the deposited polysilicon is subsequently planarized.

A further understanding of the nature and advantages of the present invention may be realized by reference to the remaining portions of the specification and the drawings.

DETAILED DESCRIPTION OF THE INVENTION

Figure 1:
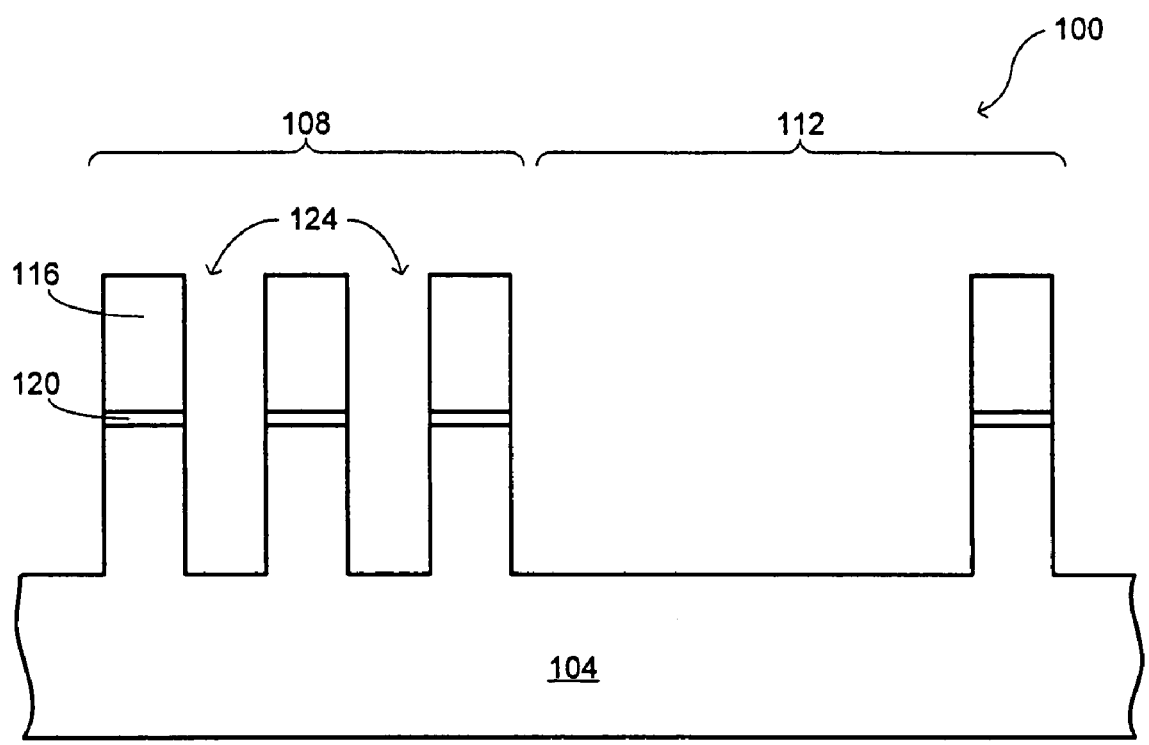
FIG. 1 is a simplified cross-sectional view of a partially completed integrated circuit that includes a plurality of shallow-trench-isolation structures.

Embodiments of the invention are directed to a process for depositing a film over a substrate having a gap formed between two adjacent raised features while accommodating a low thermal budget. Films may be deposited according to the techniques of the invention at temperatures less than 700° C., which makes them suitable for applications in which the substrate comprises strained silicon, among other applications. The biaxial stress that characterizes strained silicon may be induced by growing the silicon on a material having a lattice constant greater than that of silicon. There are various structures for which there are advantages to the use of silicon under tensile stress, such as in a channel structure for MOSFET applications as described in U.S. Pat. No. 6,059,895, the entire disclosure of which is incorporated herein for all purposes. In strained silicon, electrons experience less resistance and flow up to 70% faster, allowing chips to be produced that are 35% faster without needing to shrink the size of transistors. For this and other reasons, the use of strained silicon is expected to increase as devices having feature sizes of 65 nm or smaller are developed. Embodiments of the invention are especially suitable for such applications, including for feature sizes less than 50 nm, although they may more generally be used in any application where a low thermal budget is imposed.

Embodiments of the invention make use of a process in which an electrically insulating liner is initially deposited in the gap formed by the adjacent raised features using a first deposition process. Subsequently, polysilicon is deposited over the electrically insulating liner using a second deposition process. An example of the first deposition process is an atomic-layer deposition process conducted at a temperature less than 700° C. and an example of the second deposition process is a low-temperature polysilicon CVD process also conducted at a temperature less than 700° C. In the specific discussion below, the process is illustrated as an ex situ embodiment in which the first deposition process is performed in a first chamber, with the substrate subsequently being transferred to a second chamber for performing the second deposition process. In other embodiments, however, the processes may be performed consecutively in a single chamber without transferring the substrate out of the chamber, or may be performed in different chambers of a multichamber system with the substrate being transferred between the chambers under vacuum conditions.

To better appreciate and understand the present invention, reference is made to FIG. 2, which provides a flow diagram that depicts steps associated with one embodiment, and to FIG. 3, which provides simplified cross-sectional views of a structure at different points during the process described in connection with FIG. 2. The structure is shown as a substrate having trenches etched therein as part of an STI structure, but the principles described herein may be applied more generally to any structure that defines gaps to be filled in a semiconductor device, including IMD and PMD applications, among others.

Figure 2:
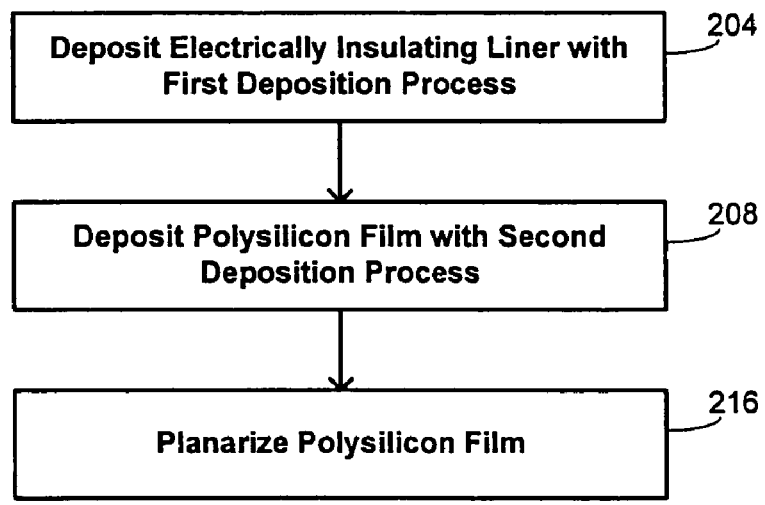
FIG. 2 is a flow diagram illustrating a method for depositing a film in one embodiment of the invention.
Figure 3:
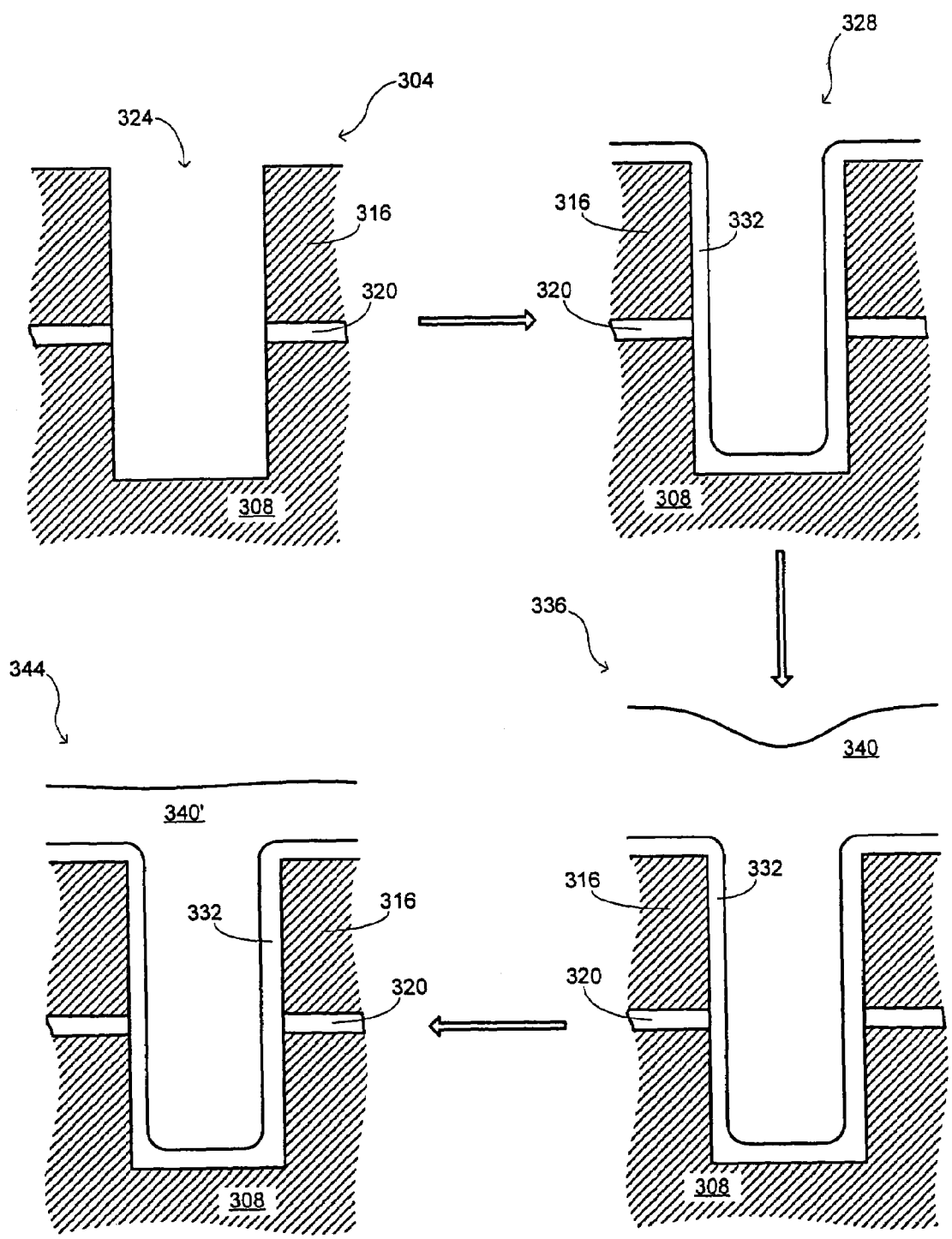
FIG. 3 provides schematic cross-sectional drawings illustrating deposition of a film over a substrate having a gap formed between adjacent raised features according to the method illustrated by FIG. 2.

As shown in the upper left of FIG. 3, the initial structure 304 includes features defining a gap 324, including a silicon nitride layer 316 and thin-pad oxide layer 320 formed over the substrate 308. At block 204 of FIG. 2, an electrically insulating liner is deposited over the substrate with the first deposition process to produce the structure 328 shown in the upper right of FIG. 3. The electrically insulating liner is denoted 332 and in some embodiments is deposited conformally over the substrate 308, as may be achieved with an ALD or metalorganic CVD ("MOCVD") process. The deposition of the electrically insulating liner is performed at a temperature less than 700° C. and may comprise, for example, a metal oxide or metal nitride layer that includes a metal selected from the group consisting of Ti, Ga, Zr, Sn, Co, V, Pt, Pd, Fe, Ni, Mo, W, Ag, Au, Hf, Cr, Cu, Mn, La, Y, Al, Gd, Nd, Sm, Si, Nb, Ta, and In. In some embodiments, the electrically insulating liner has a high dielectric constant to prevent dielectric breakdown in the completed device.

At block 208 of FIG. 2, polysilicon is deposited in the gap to produce the structure 336 shown in the lower right of FIG. 3. The polysilicon is denoted generally by reference numeral 340 and is deposited in the gap using a low-temperature polysilicon deposition process such as a CVD process. The temperature at which the polysilicon is deposited is less than 700° C. and may in some instances be less than 500° C. Because the profile for the deposited polysilicon 340 retains characteristics reflecting the underlying shape of the gap 324, it may be planarized at block 216 of FIG. 2 to produce film 340' of structure 344 shown in the lower left of FIG. 3. Suitable planarization techniques may include, for example chemical-mechanical polishing and the like.

Figure 4:
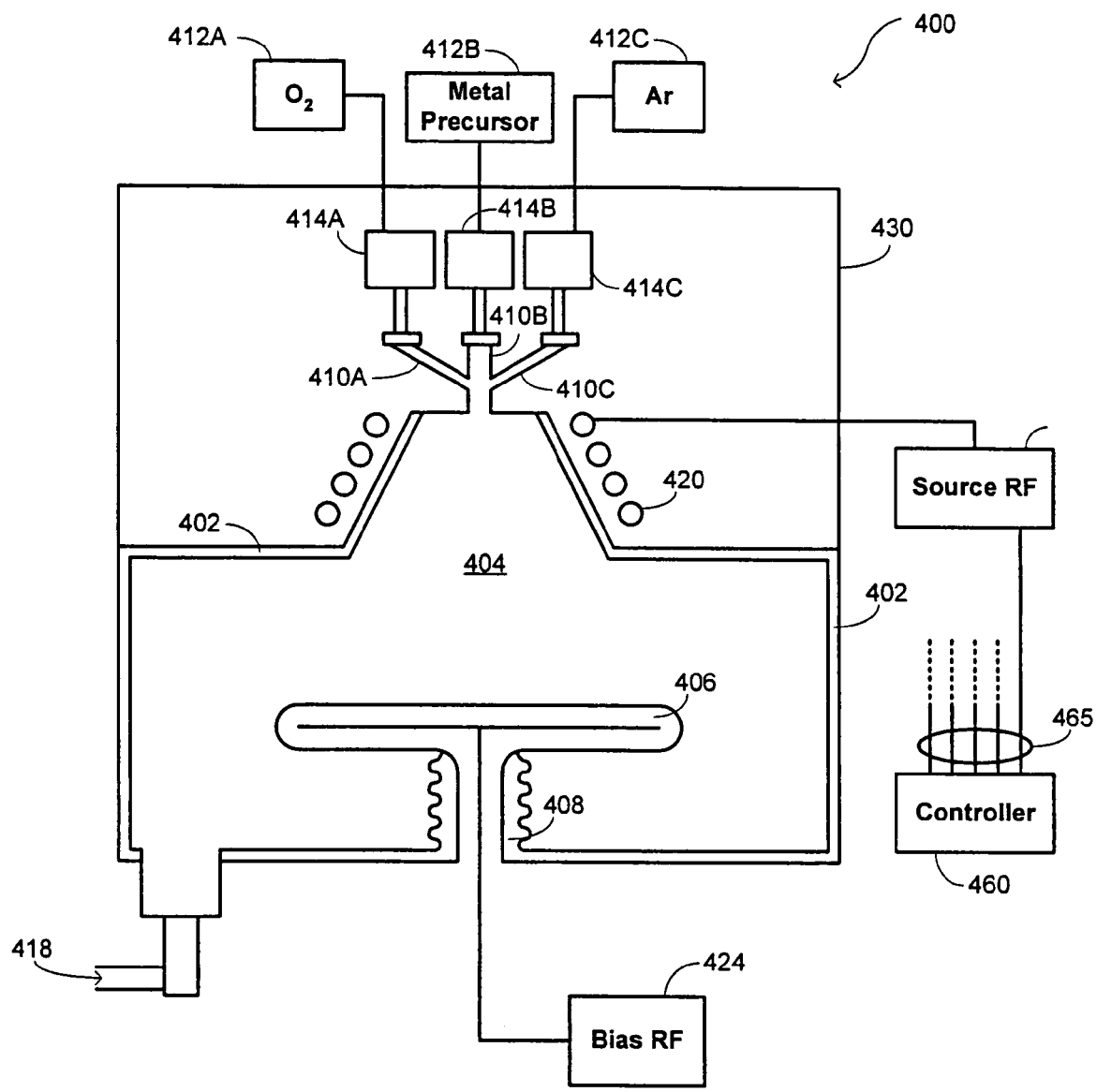
FIG. 4 provides a simplified cross-sectional view of an exemplary atomic-layer-deposition chamber that may be used to perform part of the method illustrated by FIG. 2.

FIG. 4 is a simplified cross-sectional view of one embodiment of an exemplary chamber 400 that can be used to perform the deposition of the electrically insulating liner in embodiments where atomic layer deposition is used. Chamber 400 includes a primary chamber wall 402 that encloses a process area 404. A substrate pedestal 406 supports a substrate (not shown) within processing area 404 during ALD processing. Pedestal 406 can be raised and lowered within area 404 to a desired substrate processing position and bellows 408 prevent process gases from contacting the bottom portion of the pedestal.

Gases, such as $O_2$, a metal precursor, and Ar (or another purge gas, diluent gas or sputtering agent) are introduced into processing area 404 through gas distribution channels 410A, 410B, and 410C, respectively, from gaseous sources 412A, 412B, and 412C, respectively. A variety of different metal precursors will be known to those of skill in art depending on the specific composition of the liner. For instance, in cases where the liner comprises silicon, such as $SiO_2$, the metal precursor may comprise a silane such as $SiH_4$ or another silicon precursor such as $SiCl_4$. In cases where the liner comprises aluminum, such as $Al_2O_3$, the metal precursor may comprise an aluminum compound such as trimethylaluminum $(CH_3)_3Al$. In cases where the liner comprises another metal oxide such as $HfO_2$ or $ZrO_2$, the metal precursor may comprise $HfCl_4$ or $ZrCl_4$, for example. In other instances, the metal precursor may comprise metal nitrate precursors $M(NO_3)_x$ where M is any of the metals identified above and where x is the valence of M. The use of such metal nitrate precursors is described in detail in U.S. Pat. No. 6,203,613, the entire disclosure of which is incorporated herein by reference. Also, while gaseous source 412A is shown to hold $O_2$, other sources of oxygen may be used in other embodiments such as $O_3$ and the like. Furthermore, in cases where the liner comprises a metal nitride layer instead of a metal oxide layer, the oxygen source may be substituted with a nitrogen source such as $N_2$ and the like.

Switches 414A, 414B, and 414C enable a pulse-like flow of gases into area 104 employed by ALD operations. In some embodiments of the invention, the switches 414A–C are electrically or pneumatically operated. Gases introduced into area 404 from gas distribution channels 410A–C flow radially across the surface of the substrate positioned on substrate support 406 and out through the foreline 418 under the control of a vacuum pump (not shown). Also not shown are flow rate controllers coupled between each gas source and switch 414A–C that control the flow rate of the gases to the switch.

A narrow, upper portion of area 404 is surrounded by a coil 420. RF energy from RF power source 422 can be applied to coil 420 to form a plasma from gases introduced into this region of area 404. Dissociated species from the plasma are pumped along with the flow of gases through the chamber across the surface of the substrate. RF energy can also be applied to an electrode 426 within pedestal 106 from a bias RF power source 124 in order to promote a sputtering effect during selected stages of the ALD process. An RF shield 430 (e.g., grounded sheet metal) surrounds the upper portion of chamber 400 and coil 420.

In other embodiments, the ALD chamber may include a capacitively-coupled plasma system (e.g., a mixed frequency approach that may apply bias power to the substrate, the opposing surface or both) or other type of plasma formation system. Also, in other embodiments more or fewer gas sources 412A–C may be employed with each source having a corresponding MFC, switch and gas channel.

A system controller 460 controls the operation of both chamber 400 as well as other aspects of any multichamber system (e.g., a cluster tool) the chamber 400 may be part of. Such control is effected via connections to control lines 465 (which are only partially shown). Controller 460 controls, among other things, gas flow rates, RF power levels, gas pulses, pedestal spacing, chamber temperature and chamber pressure. Controller 460 may include, for example, a memory 462, such as a hard disk drive and/or a floppy disk drive and a card rack coupled to a processor 461. The card rack may contain a single-board computer (SBC), analog and digital input/output boards, interface boards and stepper motor controller boards. System controller 460 operates under the control of a computer program stored on the hard disk drive or through other computer programs, such as programs stored on a removable disk. The computer program dictates, for example, the timing, mixture of gases, RF power levels and other parameters of a particular process carried out in each chamber.

Figure 5A:
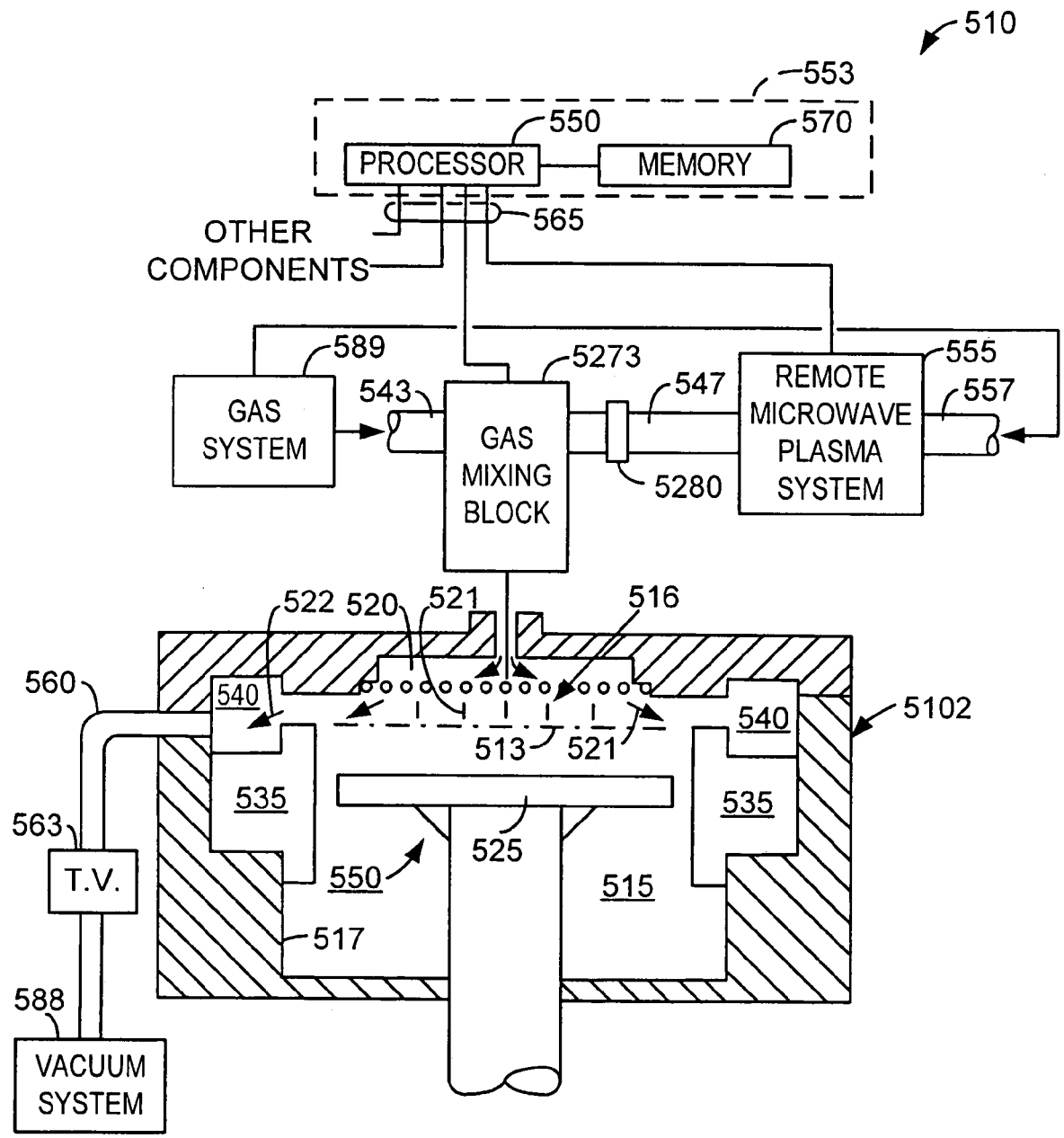
FIG. 5A is a simplified representation of a CVD apparatus that may be used to perform part of the method illustrated by FIG. 2.

Attention is now directed to FIG. 5A, which illustrates a CVD system 510 that may be used in some embodiments in depositing the polysilicon. This system is suitable for performing a variety of CVD as well as other processes, including reflow, drive-in, cleaning, etching, and gettering processes. Multiple-step processes can also be performed on a single substrate or wafer without removing the substrate from the chamber. The major components of the system include, among others, a vacuum chamber 515 that receives process and other gases from a gas delivery system 589, a vacuum system 588, a remote microwave plasma system 555, and a control system 553. These and other components are described in detail below.

The CVD apparatus 510 includes an enclosure assembly 5102 housing a vacuum chamber 515 with a gas reaction area 516. A gas distribution plate 520 is provided above the gas reaction area 516 for dispersing reactive gases and other gases, such as purge gases, through perforated holes in the gas distribution plate 520 to a wafer (not shown) that rests on a vertically movable heater 525 (also referred to as a wafer support pedestal). The heater 525 can be controllably moved between a lower position, where a wafer can be loaded or unloaded, for example, and a processing position closely adjacent to the gas distribution plate 520, indicated by a dashed line 513, or to other positions for other purposes, such as for an etch or cleaning process. A center board (not shown) includes sensors for providing information on the position of the wafer.

The heater 525 includes an electrically resistive heating element (not shown) enclosed in a ceramic. The ceramic protects the heating element from potentially corrosive chamber environments and allows the heater to attain temperatures up to about 800° C. In an exemplary embodiment, all surfaces of the heater 525 exposed to the vacuum chamber 515 are made of a ceramic material, such as aluminum oxide ($Al_2O_3$ or alumina) or aluminum nitride.

Reactive and carrier gases are supplied through the supply line 543 into a gas mixing box (also called a gas mixing block) 5273, where they are preferably mixed together and delivered to the gas distribution plate 520. The gas mixing box 5273 is preferably a dual input mixing block coupled to a process gas supply line 543 and to a cleaning/etch gas conduit 547. A valve 5280 operates to admit or seal gas or plasma from the gas conduit 547 to the gas mixing block 5273. The gas conduit 547 receives gases from an integral remote microwave plasma system 555, which has an inlet 557 for receiving input gases. During deposition processing, gas supplied to the plate 520 is vented toward the wafer surface (as indicated by arrows 521), where it may be uniformly distributed radially across the wafer surface, typically in a laminar flow.

Purging gas may be delivered into the vacuum chamber 515 from the plate 520 and/or an inlet port or tube (not shown) through the bottom wall of enclosure assembly 5102. The purging gas flows upward from the inlet port past the heater 525 and to an annular pumping channel 540. An exhaust system then exhausts the gas (as indicated by arrows 522) into the annular pumping channel 540 and through an exhaust line 560 to a vacuum system 588, which includes a vacuum pump (not shown). Exhaust gases and entrained particles are drawn from the annular pumping channel 540 through the exhaust line 560 at a rate controlled by a throttle valve system 563.

The remote microwave plasma system 555 can produce a plasma for selected applications, such as chamber cleaning or etching native oxide or residue from a process wafer. Plasma species produced in the remote plasma system 555 from precursors supplied via the input line 557 are sent via the conduit 547 for dispersion through the plate 520 to the vacuum chamber 515. Precursor gases for a cleaning application may include fluorine, chlorine, and other reactive elements. The remote microwave plasma system 555 also may be adapted to deposit plasma-enhanced CVD films by selecting appropriate deposition precursor gases for use in the remote microwave plasma system 555.

The system controller 553 controls activities and operating parameters of the deposition system. The processor 550 executes system control software, such as a computer program stored in a memory 570 coupled to the processor 550. Preferably, the memory 570 may be a hard disk drive, but of course the memory 570 may be other kinds of memory, such as read-only memory or flash memory. In addition to a hard disk drive (e.g., memory 570), the CVD apparatus 510 in a preferred embodiment includes a floppy disk drive and a card rack (not shown).

The processor 550 operates according to system control software, which includes sets of instructions that dictate the timing, mixture of gases, chamber pressure, chamber temperature, microwave power levels, susceptor position, and other parameters of a particular process. Other computer programs such as those stored on other memory including, for example, a floppy disk or another computer program product inserted in a disk drive or other appropriate drive, may also be used to operate the processor 550 to configure the CVD system 510 into various apparatus.

The processor 550 has a card rack (not shown) that contains a single-board computer, analog and digital input/output boards, interface boards and stepper motor controller boards. Various parts of the CVD system 510 conform to the Versa Modular European (VME) standard which defines board, card cage, and connector dimensions and types. The VME standard also defines the bus structure having a 16-bit data bus and 24-bit address bus.

Figure 5B:
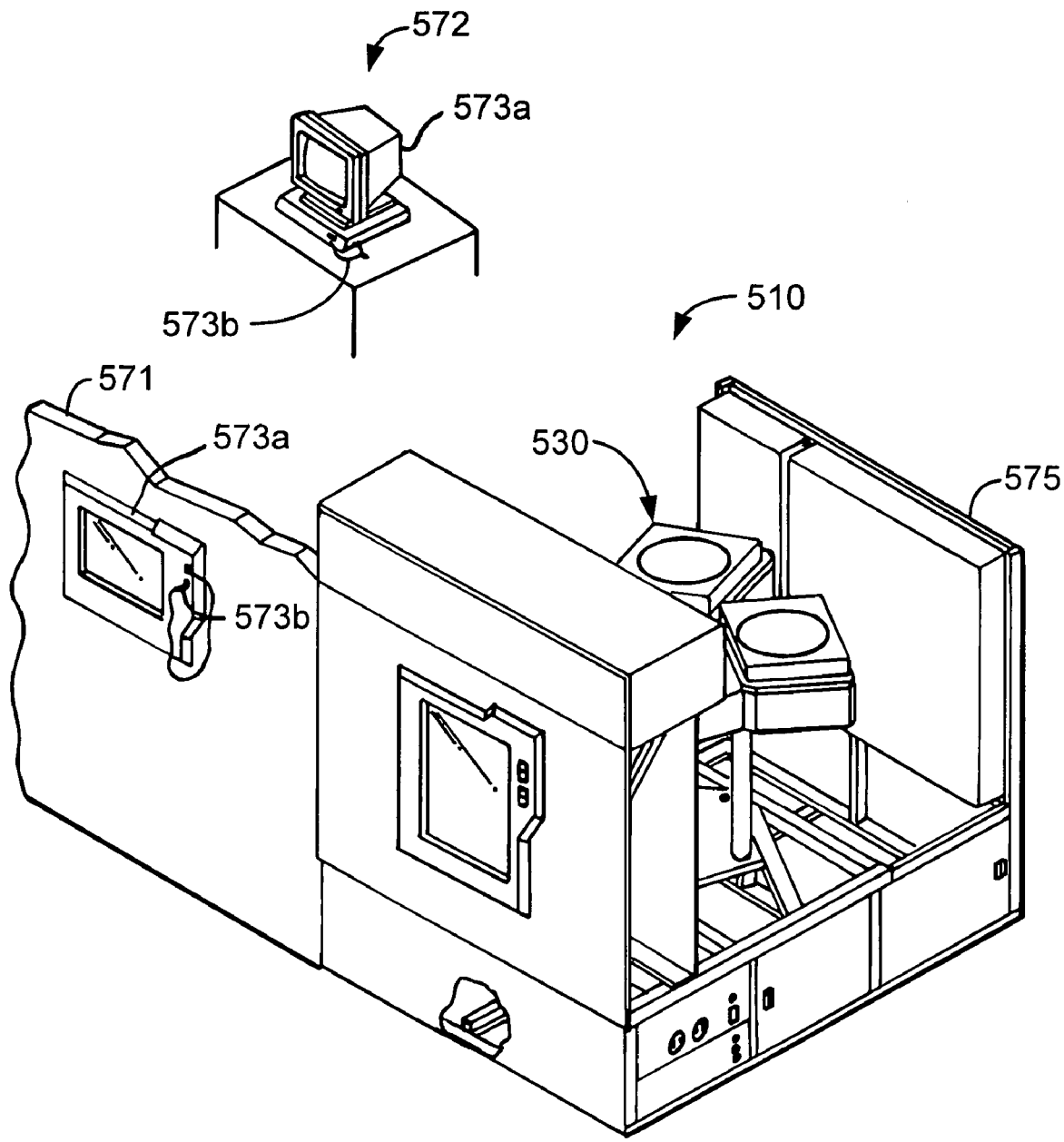
FIG. 5B is a simplified representation of the user interface for the CVD system illustrated in FIG. 5A in relation to a deposition chamber in a multi-chamber system.

FIG. 5B is a simplified diagram of a user interface in relation to the CVD apparatus chamber 530. The CVD apparatus 510 includes one chamber of a multichamber system. Wafers may be transferred from one chamber to another for additional processing. In some cases the wafers are transferred under vacuum or a selected gas. The interface between a user and the processor is via a CRT monitor 573*a* and a light pen 573*b*. A mainframe unit 575 provides electrical, plumbing, and other support functions for the CVD apparatus 510. Exemplary mainframe units compatible with the illustrative embodiment of the CVD apparatus are currently commercially available as the PRECISION 5000™, the CENTURA 5200™, and the PRODUCER SE™ systems from APPLIED MATERIALS, INC. of Santa Clara, Calif.

In one embodiment two monitors 573*a* are used, one mounted in the clean room wall 571 for the operators, and the other behind the wall 572 for the service technicians. Both monitors 573*a* simultaneously display the same information, but only one light pen 573*b* is enabled. The light pen 573*b* detects light emitted by the CRT display with a light sensor in the tip of the pen. To select a particular screen or function, the operator touches a designated area of the display screen and pushes the button on the pen 573*b*. The touched area changes its highlighted color, or a new menu or screen is displayed, confirming communication between the light pen and the display screen. Of course, other devices, such as a keyboard, mouse, or other pointing or communication device, may be used instead of or in addition to the light pen 573*b* to allow the user to communicate with the processor.

Figure 5C:
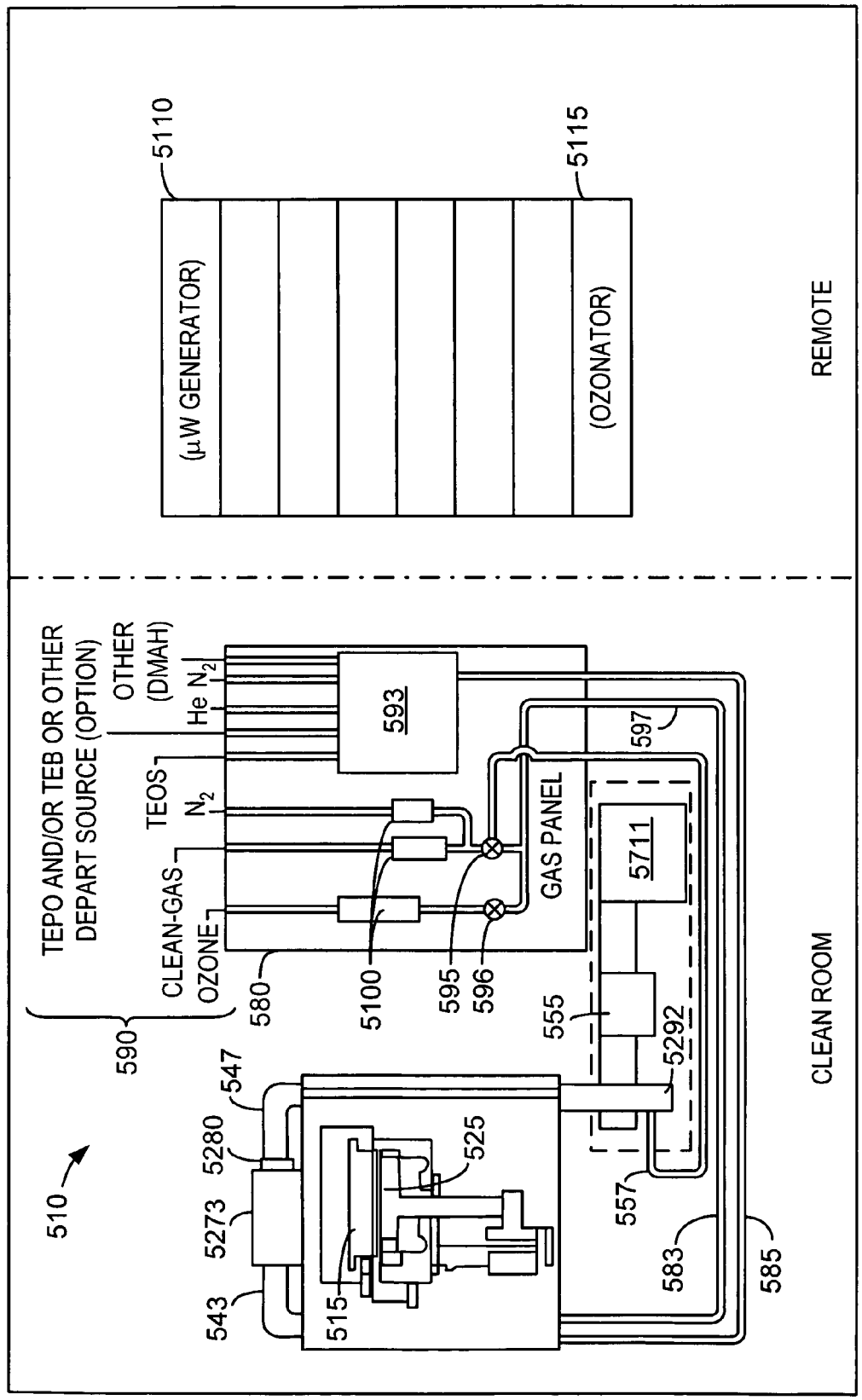
FIG. 5C is a simplified diagram of a gas panel and supply lines in relation to the deposition chamber shown in FIG. 5A.

FIG. 5C illustrates a general overview of an embodiment of the CVD apparatus 510 in relation to a gas supply panel 580 located in a clean room. As discussed above, the CVD system 510 includes a chamber 515 with a heater 525, a gas mixing box 5273 with inputs from an inlet tube 543 and a conduit 547, and remote microwave plasma system 555 with input line 557. As mentioned above, the gas mixing box 5273 is for mixing and injecting deposition gas(es) and clean gas(es) or other gas(es) through the inlet tube 543 to the processing chamber 515.

The remote microwave plasma system 555 is integrally located and mounted below the chamber 515 with the conduit 547 coming up alongside the chamber 515 to the gate valve 5280 and the gas mixing box 5273, located above the chamber 515. Microwave generator 5110 and ozonator 5115 are located remote from the clean room. Supply lines 583 and 585 from the gas supply panel 580 provide reactive gases to the gas supply line 543. The gas supply panel 580 includes lines from gas or liquid sources 590 that provide the process gases for the selected application. The gas supply panel 580 has a mixing system 593 that mixes selected gases before flow to the gas mixing box 5273. In some embodiments, gas mixing system 593 includes a liquid injection system for vaporizing reactant liquids such as tetraethylorthosilicate ("TEOS"), triethylborate ("TEB"), and triethylphosphate ("TEPO"). Vapor from the liquids is usually combined with a carrier gas, such as helium. Supply lines for the process gases may include (i) shut-off valves 595 that can be used to automatically or manually shut off the flow of process gas into line 585 or line 557, and (ii) liquid flow meters (LFM) 5100 or other types of controllers that measure the flow of gas or liquid through the supply lines.

Figure 5D:
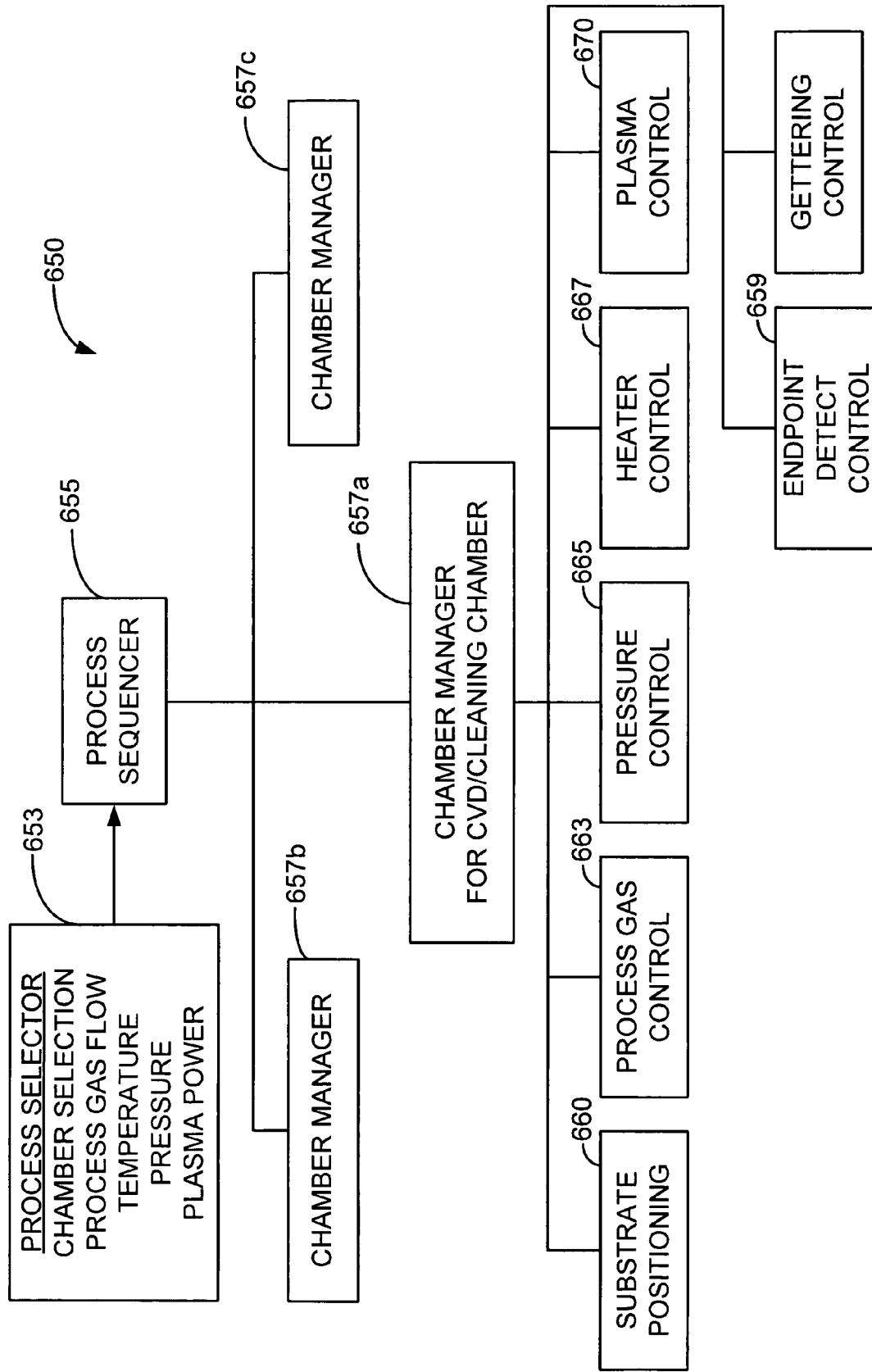
FIG. 5D is a simplified of a block diagram of the hierarchical control structure of system control software for use with the CVD apparatus of FIGS. 5A–5C in an embodiment.

FIG. 5D is an illustrative block diagram of the hierarchical control structure of the system control software, computer program 650, according to a specific embodiment. A processes for depositing a film, performing a clean, or performing reflow or drive-in can be implemented using a computer program product that is executed by the processor 550. The computer program code can be written in any conventional computer readable programming language, such as 68000 assembly language, C, C++, Pascal, Fortran, or other language. Suitable program code is entered into a single file, or multiple files, using a conventional text editor and is stored or embodied in a computer-usable medium, such as the system memory.

If the entered code text is in a high-level language, the code is compiled, and the resultant compiler code is then linked with an object code of precompiled WINDOWS™ library routines. To execute the linked compiled object code, the system user invokes the object code, causing the computer system to load the code in memory, from which the CPU reads and executes the code to configure the apparatus to perform the tasks identified in the program.

A user enters a process set number and process chamber number into a process selector subroutine 653 by using the light pen to select a choice provided by menus or screens displayed on the CRT monitor. The process sets, which are predetermined sets of process parameters necessary to carry out specified processes, are identified by predefined set numbers. The process selector subroutine 653 identifies (i) the desired process chamber, and (ii) the desired set of process parameters needed to operate the process chamber for performing the desired process. The process parameters for performing a specific process relate to process conditions such as, for example, process gas composition and flow rates, temperature, pressure, plasma conditions such as magnetron power levels (and alternatively to or in addition to high- and low-frequency RF power levels and the low-frequency RF frequency, for embodiments equipped with RF plasma systems), cooling gas pressure, and chamber wall temperature. The process selector subroutine 653 controls what type of process (e.g. deposition, wafer cleaning, chamber cleaning, chamber gettering, reflowing) is performed at a certain time in the chamber. In some embodiments, there may be more than one process selector subroutine. The process parameters are provided to the user in the form of a recipe and may be entered utilizing the light pen/CRT monitor interface.

A process sequencer subroutine 655 has program code for accepting the identified process chamber and process parameters from the process selector subroutine 653, and for controlling the operation of the various process chambers. Multiple users can enter process set numbers and process chamber numbers, or a single user can enter multiple process set numbers and process chamber numbers, so process sequencer subroutine 655 operates to schedule the selected processes in the desired sequence. Preferably, the process sequencer subroutine 655 includes program code to perform the tasks of (i) monitoring the operation of the process chambers to determine if the chambers are being used, (ii) determining what processes are being carried out in the chambers being used, and (iii) executing the desired process based on availability of a process chamber and the type of process to be carried out.

Conventional methods of monitoring the process chambers, such as polling methods, can be used. When scheduling which process is to be executed, the process sequencer subroutine 655 can be designed to take into consideration the present condition of the process chamber being used in comparison with the desired process conditions for a selected process, or the "age" of each particular user-entered request, or any other relevant factor a system programmer desires to include for determining scheduling priorities.

Once the process sequencer subroutine 655 determines which process chamber and process set combination is going to be executed next, the process sequencer subroutine 655 initiates execution of the process set by passing the particular process set parameters to a chamber manager subroutine 657a–c which controls multiple processing tasks in the process chamber according to the process set determined by the process sequencer subroutine 655. For example, the chamber manager subroutine 657a has program code for controlling CVD and cleaning process operations in the process chamber. Chamber manager subroutine 657 also controls execution of various chamber component subroutines which control operation of the chamber components necessary to carry out the selected process set. Examples of chamber component subroutines are substrate positioning subroutine 660, process gas control subroutine 663, pressure control subroutine 665, heater control subroutine 667, plasma control subroutine 670, endpoint detect control subroutine 659, and gettering control subroutine 669.

Depending on the specific configuration of the CVD chamber, some embodiments include all of the above subroutines, while other embodiments may include only some of the subroutines. Those having ordinary skill in the art would readily recognize that other chamber control subroutines can be included depending on what processes are to be performed in the process chamber.

In operation, the chamber manager subroutine 657a selectively schedules or calls the process component subroutines in accordance with the particular process set being executed. The chamber manager subroutine 657a schedules the process component subroutines much like the process sequencer subroutine 655 schedules which process chamber and process set are to be executed next. Typically, the chamber manager subroutine 657a includes the steps of monitoring the various chamber components, determining which components need to be operated based on the process parameters for the process set to be executed, and initiating execution of a chamber component subroutine responsive to the monitoring and determining steps.

Operation of particular chamber component subroutines will now be described with reference to FIGS. 5A and 5D. The substrate positioning subroutine 660 comprises program code for controlling chamber components that are used to load the substrate onto the heater 525 and, optionally, to lift the substrate to a desired height in the chamber to control the spacing between the substrate and the gas distribution manifold 520. When a substrate is loaded into the process chamber 515, the heater 525 is lowered to receive the substrate and then the heater 525 is raised to the desired height. In operation, the substrate positioning subroutine 660 controls movement of the heater 525 in response to process set parameters related to the support height that are transferred from the chamber manager subroutine 657a. The height of the heater 525, and thus the spacing between a substrate disposed thereon and the gas distribution plate 520, may be varied during processing to affect the rate of deposition.

The process gas control subroutine 663 has program code for controlling process gas composition and flow rates. The process gas control subroutine 663 controls the state of safety shut-off valves, and also ramps the mass flow controllers up or down to obtain the desired gas flow rate. Typically, the process gas control subroutine 663 operates by opening the gas supply lines and repeatedly (i) reading the necessary mass flow controllers, (ii) comparing the readings to the desired flow rates received from the chamber manager subroutine 657a, and (iii) adjusting the flow rates of the gas supply lines as necessary. Furthermore, the process gas control subroutine 663 includes steps for monitoring the gas flow rates for unsafe rates, and activating the safety shut-off valves when an unsafe condition is detected. Alternative embodiments could have more than one process gas control subroutine, each subroutine controlling a specific type of process or specific sets of gas lines.

In some processes, an inert gas, such as nitrogen or argon, is flowed into the chamber to stabilize the pressure in the chamber before reactive process gases are introduced. For these processes, process gas control subroutine 663 is programmed to include steps for flowing the inert gas into the chamber for an amount of time necessary to stabilize the pressure in the chamber, and then the steps described above would be carried out. Additionally, when a process gas is to be vaporized from a liquid precursor, such as TEOS, process gas control subroutine 663 would be written to include steps for bubbling a delivery gas such as helium through the liquid precursor in a bubbler assembly, or controlling a liquid injection system to spray or squirt liquid into a stream of carrier gas, such as helium, through the LFM. When a bubbler is used for this type of process, the process gas control subroutine 663 regulates the flow of the delivery gas, the pressure in the bubbler, and the bubbler temperature in order to obtain the desired process gas flow rates. As discussed above, the desired process gas flow rates are transferred to the process gas control subroutine 663 as process parameters.

Furthermore, the process gas control subroutine 663 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 665 comprises program code for controlling the pressure in the chamber by regulating the aperture size of the throttle valve in the exhaust system of the chamber. The aperture size of the throttle valve is set to control the chamber pressure at a desired level in relation to the total process gas flow, the size of the process chamber, and the pumping set-point pressure for the exhaust system. When the pressure control subroutine 665 is invoked, the desired or target pressure level is received as a parameter from the chamber manager subroutine 657a. The pressure control subroutine 665 measures the pressure in the chamber by reading one or more conventional pressure manometers connected to the chamber, compares the measure value(s) to the target pressure, obtains proportional, integral, and differential ("PID") values corresponding to the target pressure from a stored pressure table, and adjusts the throttle valve according to the PID values.

Alternatively, the pressure control subroutine 665 can be written to open or close the throttle valve to a particular aperture size, i.e. a fixed position, to regulate the pressure in the chamber. Controlling the exhaust capacity in this way does not invoke the feedback control feature of the pressure control subroutine 665.

The heater control subroutine 667 comprises program code for controlling the current to a heating unit that is used to heat the substrate. The heater control subroutine 667 is also invoked by the chamber manager subroutine 657a and receives a target, or set-point, temperature parameter. The heater control subroutine 667 measures the temperature by measuring voltage output of a thermocouple located in the heater, comparing the measured temperature to the set-point temperature, and increasing or decreasing current applied to the heating unit to obtain the set-point temperature. The temperature is obtained from the measured voltage by looking up the corresponding temperature in a stored conversion table, or by calculating the temperature using a fourth-order polynomial. The heater control subroutine 667 includes the ability to gradually control a ramp up or down of the heater temperature. This feature helps to reduce thermal cracking in the ceramic heater. Additionally, a built-in fail-safe mode can be included to detect process safety compliance, and can shut down operation of the heating unit if the process chamber is not properly set up.

Figure 6:
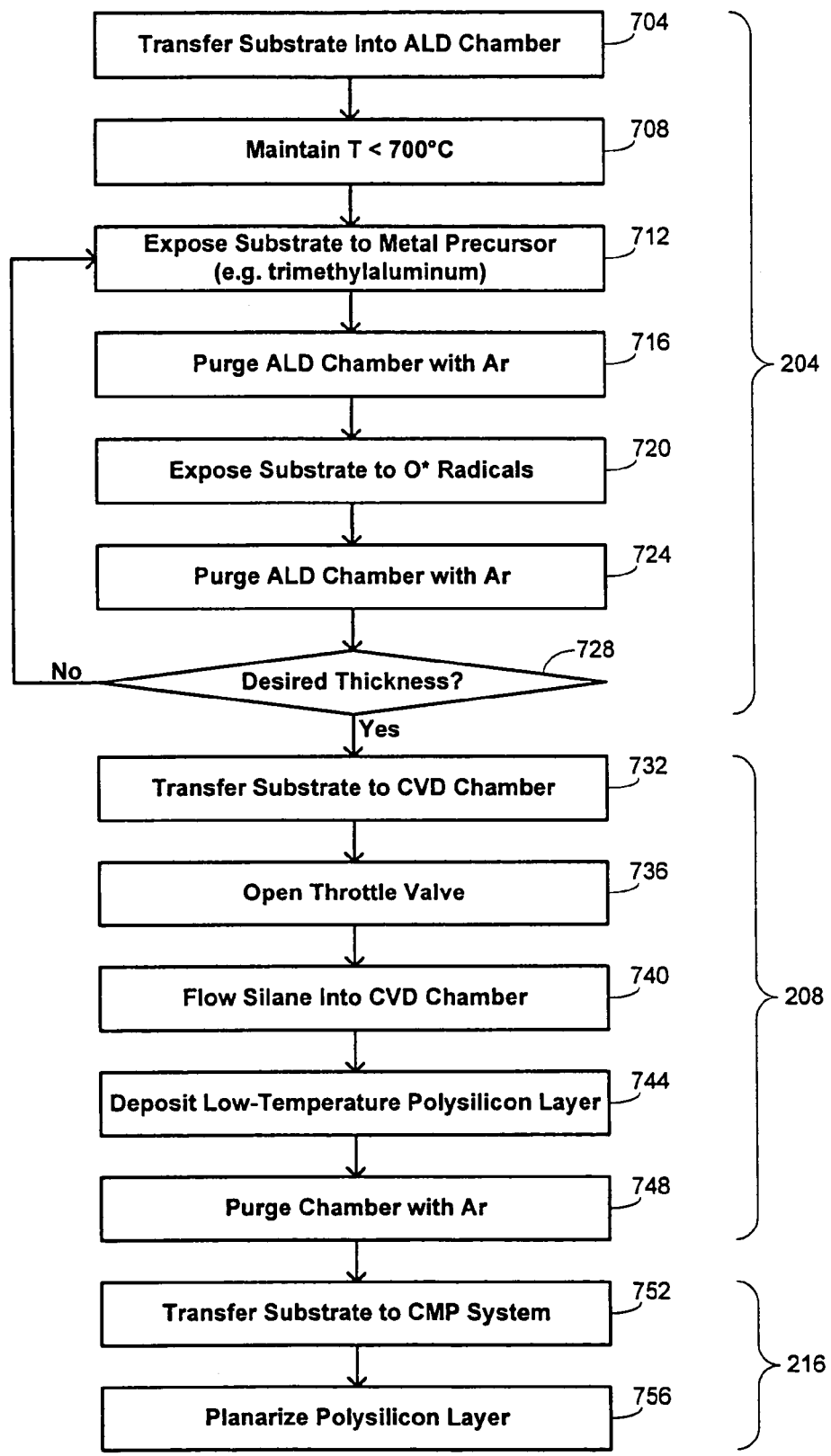
FIG. 6 is a flow diagram illustrating an exemplary process for depositing a film over a substrate in an embodiment of the invention.

FIG. 6 provides a flow diagram that illustrates a specific process that makes use of the ALD and CVD chambers described above. At block 704, a substrate is transferred into an ALD chamber for processing. In some instances, the composition of the substrate may impose a low thermal budget on the processing, such as where the substrate comprises strained silicon. Accordingly, as indicated at block 708, a processing temperature is maintained within the ALD chamber at less than 700° C. throughout the deposition 204 of the electrically insulating liner. A variety of different ALD techniques may be used, with the specific one illustrated in FIG. 6 resulting in the deposition of an $Al_2O_3$ liner by exposing the substrate alternatively to flows of an aluminum source and to oxygen radicals. Thus, as indicated at block 712, after positioning within the chamber, the substrate is exposed to a metal precursor, such as $(CH_3)_3Al$ for the exemplary embodiment. Typically, exposure during this stage of the ALD process is for a time between about 1 and 10 seconds so that less than about ten monolayers, and perhaps even less than a single monolayer, of the metal precursor molecules are adsorbed onto the surface of the substrate.

In the illustrated embodiment, the chamber is then purged at block 716 by flowing an inert gas through the chamber. Ar or any other inert gas may be used to purge the chamber. In some alternative embodiments, the chamber may instead be evacuated of the residual metal precursor molecules by stopping the flow of all gases into the chamber and pumping out the residual molecules with a vacuum pump. In still other embodiments, a flow of oxygen may be maintained even during the exposure of the substrate to the metal precursor at block 712, but under processing conditions in which the metal precursor and oxygen do not react.

Irrespective of how the transition from exposure to the metal precursor to the subsequent stage is managed, the substrate is exposed to such dissociated reactant radicals at block 720. In the illustrated embodiment, such reactant radicals comprise oxygen radicals, but might comprise radicals of other elements such as nitrogen in different embodiments. The oxygen or other radicals react with the adsorbed metal-precursor molecules to form the insulative liner with the desired composition, in this instance $Al_3O_2$. It is generally desirable to fully oxidize the substrate during the exposure at block 720 so that metal-rich striations are not formed within the insulative liner. It is also desirable, however, to stop the reactive oxygen exposure as soon as complete oxidation occurs in order to improve throughput of the process and save costs associated with excess gas. To this end, some embodiments of the invention employ an in situ monitor, such as an interferometer, to determine when full oxidation has occurred. The interferometer detects radiation reflected from the surface of the substrate and compares interference patterns to previous patterns that represent a fully oxidized liner. When it is determined that full oxidation has occurred, the interferometer sends a signal that is used to endpoint this stage of the ALD process 204. Byproducts from the reaction are then pumped out of the chamber along with unreacted radicals.

In is possible in some embodiments to bias the reactive radicals towards the substrate. Such biasing promotes a sputter effect from the oxygen radicals simultaneous with the production of the $Al_3O_2$ molecules from the reactants. Such a bias may be provided, for example, by applying RF energy to a pedestal or other component that holds the substrate in the chamber. The generation of sputtering simultaneous with the growth of the liner may introduce an anisotropy in the liner growth. In other embodiments, a substantially conformal liner is grown without biasing the radicals.

At block 724, the chamber may again be purged with an inert gas such as Ar, although alternatively any of the other methods for transitioning between stages of the process described above may be used. At block 728, a determination is made whether the liner has been deposited with the desired thickness, with the successive exposures to the metal precursor and reactant radicals being repeated until the desired thickness is reached.

As previously noted, this process may be used to grow the liner at temperatures less than 700° C., with the temperature being elevated to about 300–500° C. in some embodiments. The use of such elevated temperatures tends to increase the liner deposition rate by increasing the number of monolayers of the metal-precursor molecules adsorbed onto the substrate during the first stage so that more reactions take place during the second stage. In other embodiments, the temperatures may be less than 300° C. or may be between 500 and 700° C.

Once the electrically insulating liner has been deposited, the substrate may be transferred at block 732 to a CVD chamber for deposition of the polysilicon. The throttle valve is opened at block 736 and a silane or another silicon-containing gas flowed into the chamber at block 740. In some cases, additional gases that include dopant atoms may also be flowed into the chamber at block 740 in embodiments where the deposited polysilicon is to be doped. For example, precursor gas of $SiF_4$ may additionally be flowed to fluorinate the film, a precursor gas of $PH_3$ may be flowed to phosphorate the film, a precursor gas of $B_2H_6$ may be flowed to boronate the film, a flow of $N_2$ may be flowed to nitrogenate the film, and the like. In addition, a fluent gas may additionally be flowed at block 740, the fluent gas comprising a light gas such as $H_2$, He, or Ne, or comprising a heavier gas such as Ar. The choice of different fluent gases may affect sputtering characteristics during the deposition and different gases may be preferred depending on such physical factors as the aspect ratio and width of the gap to be filled.

At block 744, a polysilicon layer is deposited using a low-temperature polysilicon deposition process to fill the gap. The relative quantities of polysilicon and amorphous silicon that are deposited may depend on the temperature of the process, which may accordingly be selected to maximize the deposition of polysilicon. Using this technique gapfill may be achieved at temperatures less than 700° C. for features having a width less than 0.05 μm and an aspect ration that exceeds 10:1. After the deposition, the chamber may be purged, such as with Ar at block 748.

The substrate may subsequently be transferred at block 752 to a planarizing system such as a CMP system, numerous examples of which are well known to those of skill in the art. At block 756, the polysilicon layer is then planarized with the CMP system.

Having fully described several embodiments of the present invention, many other equivalents and alternative embodiments will be apparent to those skilled in the art. As previously noted, although the description has focused on a combination of ALD and CVD processes for exemplary purposes, the techniques described herein may more generally be used with any deposition processes suitable for depositing the electrically insulating liner and polysilicon. These and other equivalents and alternatives are intended to be included within the scope of the present invention.

What is claimed is:

1. A shallow-trench-isolation deposition method comprising:
   etching structures in a strained-silicon substrate to form a gap between two adjacent raised features;
   depositing an electrically insulating liner in the gap using an atomic-layer-deposition process at a temperature less than 700° C. to partially fill the gap; and
   depositing polysilicon over the electrically insulating liner and within the gap at a temperature less than 700° C. to accommodate a thermal budget imposed by a composition of the strained-silicon substrate.

2. The method recited in claim 1 wherein depositing the electrically insulating liner comprises:
   exposing the substrate to a metal precursor reactant introduced into a chamber in which the substrate is disposed such that one or more layers of the metal precursor reactant are adsorbed onto the substrate;
   purging the chamber of the metal precursor reactant; and
   exposing the adsorbed metal precursor reactant to radicals formed from a second reactant to produce the electrically insulating liner.

3. The method recited in claim 2 wherein the radicals comprise oxygen radicals, whereby the electrically insulating liner comprises a metal oxide layer.

4. The method recited in claim 2 wherein the radicals comprise nitrogen radicals, whereby the electrically insulating liner comprises a metal nitride layer.

5. The method recited in claim 2 wherein the metal precursor reactant comprises a metal selected from the group consisting of Ti, Ga, Zr, Sn, Co, V, Pt, Pd, Fe, Ni, Mo, W, Ag, Au, Hf, Cr, Cu, Mn, La, Y, Al, Gd, Nd, Sm, Si, Nb, Ta, and In.

6. The method recited in claim 1 further comprising planarizing the deposited polysilicon.

7. The method recited in claim 1 wherein depositing polysilicon compnses:
   providing a flow of a silicon-containing gas to chamber; and
   heating the silicon-containing gas to a temperature less than 700° C. to deposit the polysilicon from the flow with a chemical-vapor-deposition process.

8. The method recited in claim 7 wherein depositing polysilicon further comprises providing a flow of a dopant precursor gas to the chamber, whereby the polysilicon is doped.

9. A substrate having a film deposited according to the method recited in claim 1.

10. A method for depositing a film over a substrate having a gap formed between two adjacent raised surfaces, the method comprising:
    exposing the substrate to a metal precursor reactant introduced into a first chamber in which the substrate is disposed such that one or more layers of the metal precursor reactant are adsorbed onto the substrate;
    purging the first chamber of the metal precursor reactant;
    exposing the adsorbed metal precursor reactant to radicals formed from a second reactant to produce an electrically insulating liner in the gap;
    providing a flow of a silicon-containing gas to a second chamber in which the substrate is disposed; and
    heating the silicon-containing gas to deposit polysilicon over the electrically insulating liner and within the gap,
    wherein a temperature of the substrate is less than 700° C. for each of the recited steps to accommodate a thermal budget imposed by a composition of the substrate.

11. The method recited in claim 10 wherein the first and second chambers are the same chamber.

12. The method recited in claim 10 wherein the radicals comprise oxygen radicals, whereby the electrically insulating liner comprises a metal oxide layer.

13. The method recited in claim 10 wherein the metal precursor reactant comprises a metal selected from the group consisting of Ti, Ga, Zr, Sn, Co, V, Pt, Pd, Fe, Ni, Mo, W, Ag, Au, Hf, Cr, Cu, Mn, La, Y, Al, Gd, Nd, Sm, Si, Nb, Ta, and In.

14. The method recited in claim 10 further comprising planarizing the deposited polysilicon.

15. The method recited in claim 10 wherein the substrate comprises strained silicon.

16. A substrate having a film deposited according to the method recited in claim 10.

* * * * *